United States Patent
Gu

(10) Patent No.: US 7,107,976 B2
(45) Date of Patent: Sep. 19, 2006

(54) INDUCTIVE LOAD POWERING ARRANGEMENT

(75) Inventor: Chengyu C. Gu, Troy, MI (US)

(73) Assignee: Siemens VDO Automotive Corporation, Auburn Hills ( * ) Notice: Subject to any disclaimer, the term of this patent is extended or adjusted under 35 U.S.C. 154(b) by 153 days.

(21) Appl. No.: 10/779,055

(22) Filed: Feb. 13, 2004

(65) Prior Publication Data

US 2004/0160725 A1   Aug. 19, 2004

Related U.S. Application Data

(60) Provisional application No. 60/447,109, filed on Feb. 13, 2003.

(51) Int. Cl.
F02P 3/05   (2006.01)
H01H 47/32   (2006.01)

(52) U.S. Cl. .................. 123/644; 123/480; 361/152

(58) Field of Classification Search ................. 123/644, 123/490; 361/152, 154, 187; 315/224
See application file for complete search history.

(56) References Cited

U.S. PATENT DOCUMENTS

| | | | | |
|---|---|---|---|---|
| 4,653,447 A | * | 3/1987 | Linder et al. ............. | 123/357 |
| 5,207,208 A | * | 5/1993 | Ward ....................... | 123/596 |
| 5,835,330 A | * | 11/1998 | Kirschner et al. ......... | 361/152 |
| 6,796,297 B1 | * | 9/2004 | Schmied et al. .......... | 123/609 |

FOREIGN PATENT DOCUMENTS

GB       2368210 A1 *   4/2002   ................. 361/118

* cited by examiner

Primary Examiner—Stephen K. Cronin
Assistant Examiner—Arnold Castro

(57) ABSTRACT

An inductive load powering arrangement (20) utilizes current monitoring on only one side of the load (22) which in one example is a fuel injector coil. In disclosed examples, a high side driver (28) is on a first side of the coil (22) and the current monitoring occurs on only the first side of the coil (22). The low side driver (30) on an opposite side of the coil (22) is used for chopping to control the level of current in the operating coil (22).

16 Claims, 3 Drawing Sheets

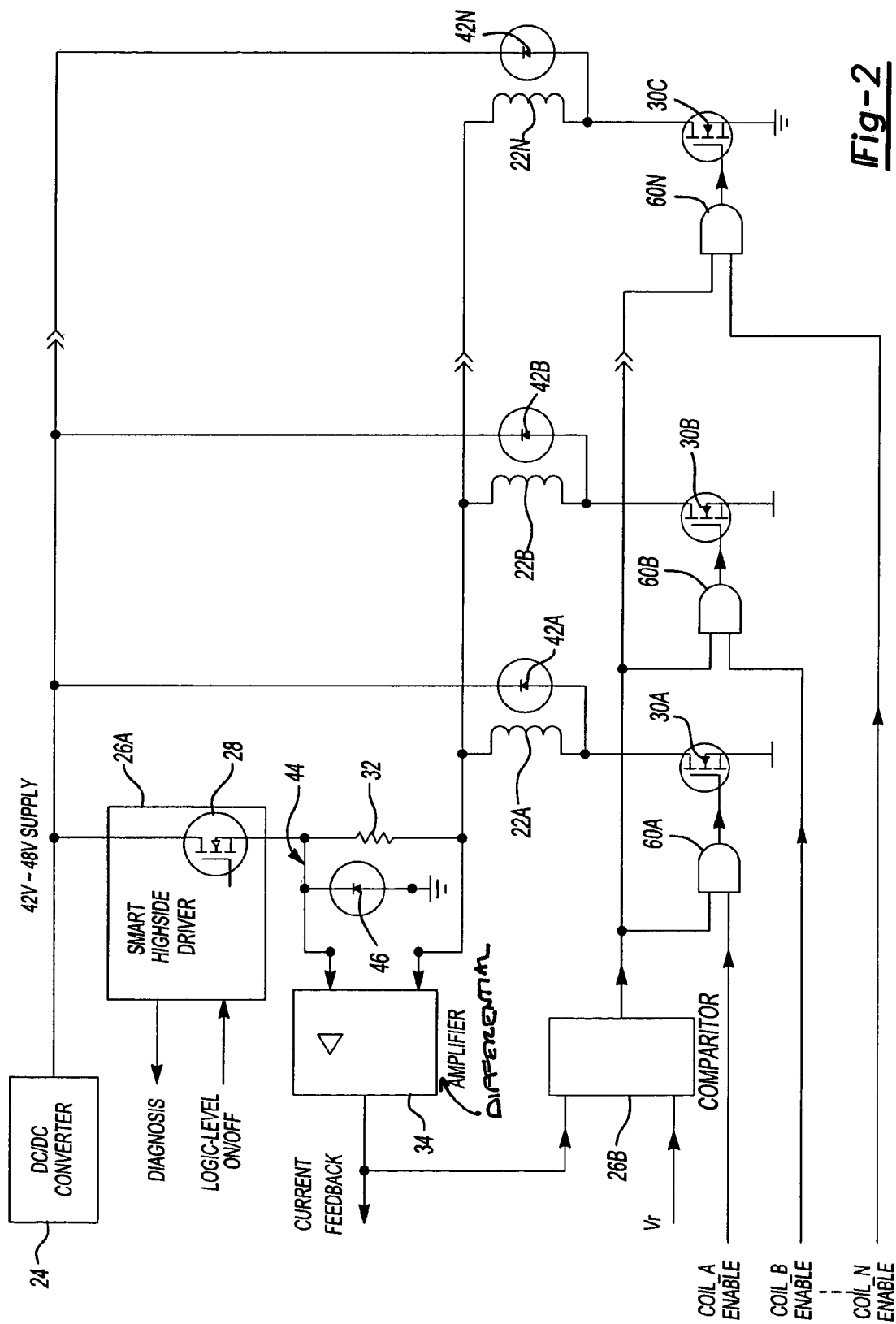

INDUCTIVE LOAD POWERING ARRANGEMENT

CROSS REFERENCE TO RELATED APPLICATIONS

This application claims priority to Provisional Application No. 60/447,109, which was filed on Feb. 13, 2003.

BACKGROUND OF THE INVENTION

This invention generally relates to powering inductive loads such as coils in fuel injectors. More particularly, this invention relates to monitoring the current only on the high side of an inductive load to achieve a desired performance.

Fuel injectors are well known. Typical arrangements include a coil that is energized in a manner that allows for fuel supply to a vehicle engine according to a control strategy responsive to a driver manipulating an accelerator pedal, for example. Typical arrangements include a high side driver and a low side driver on opposite sides of the coil that is energized to control the fuel injector. A typical arrangement includes a shunt resistor associated with each driver so that the current on each side of the coil can be monitored.

Conventional arrangements require monitoring the current on both sides of the coil to achieve proper coil operation and to avoid over current situations. With conventional arrangements, the high side driver and low side driver are turned on when fuel injector operation is required. As the current in the coil rises to a maximum desired level, the high side driver typically is turned off and on in a cyclical manner to allow the current to cyclically rise and fall within a desired range. During this "chopping" using the high side driver, the coil is energized sufficient to allow fuel flow as needed. The low side driver typically remains on throughout the entire interval when the coil is energized. At the end of fuel injection operation the low side driver and the high side driver are turned off so the coil can be deenergized.

The current associated with the low side driver typically is monitored to provide information regarding the level of current in the coil. That provides information for operating the high side driver to achieve the chopping necessary to keep the coil current within desired limits.

The current on the high side typically is monitored to provide a failure protection mode to protect against a high side overcurrent situation.

Conventional arrangements have proven useful but have certain shortcomings and drawbacks. Conventional arrangements are relatively expensive because the operational amplifier needed for monitoring the current on the high side driver side of the coil typically is a relatively complicated device even though it is almost always never actually used for purposes of turning off current to the coil. Additionally, the circuitry required for achieving the necessary chopping with the high side driver is relatively complicated and occupies a large space on a circuit board. The overall size of the control module, therefore, becomes larger than may be desirable for some situations. Additionally, the conventional arrangement requires an amplifier and a comparator on both sides of the coil, which increases the number of parts and, again, keeps the size of the module relatively large. The additional weight of such control modules is another drawback. Further, conventional arrangements require increased testing, which increases cost, and tend to have potential reliability issues presented by the number of components required.

There is a need for an improved arrangement for powering inductive loads such as fuel injectors that does not suffer from the drawbacks and shortcomings mentioned above. This invention provides such an arrangement.

SUMMARY OF THE INVENTION

In general terms, this invention is an arrangement for powering an inductive load that utilizes information regarding current on only one side of the inductive load. The current information is useful for control and over-current protection.

In one example, there is a high side driver on a first side of the fuel injector coil and a low side driver on an opposite side of the coil. A controller monitors the current only on the first side of the coil for making decisions regarding how to control the drivers for properly powering the coil. The controller cyclically turns the low side driver on and off to control an operating current in the coil to provide chopping, which was previously achieved using a high side driver.

In one example, a differential amplifier is associated with a shunt resistor that is associated with the high side driver. The differential amplifier bandwidth is at least three times the chopping frequency in one example. The example differential amplifier in one embodiment has a common mode rejection ratio that is at least 80 dB. The same example differential amplifier has a bandwidth between about 100 KHz and 220 KHz.

The various features and advantages of this invention will become apparent to those skilled in the art from the following detailed description of the currently preferred embodiment. The drawings that accompany the detailed description can be briefly described as follows.

BRIEF DESCRIPTION OF THE DRAWINGS

FIG. 2 schematically illustrates selected portions of another fuel injector powering arrangement designed according to an embodiment of this invention where a group of injector coils share a single high side driver.

DETAILED DESCRIPTION OF THE PREFERRED EMBODIMENT

Figure 1:
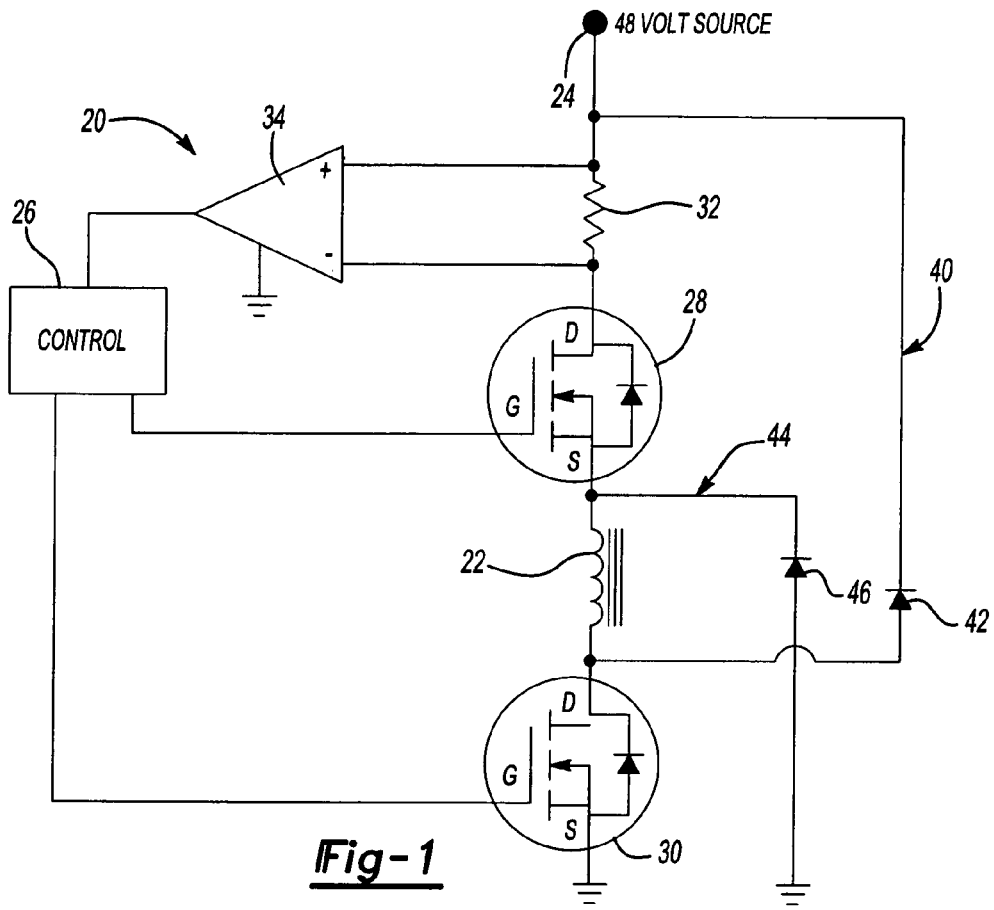
FIG. 1 schematically illustrates selected portions of a fuel injector powering device designed according to an embodiment of this invention.

FIG. 1 schematically shows a device 20 for powering an inductive load such as a fuel injector coil 22 using a power source 24. While a fuel injector coil is used as an example inductor load, the disclosed current monitoring techniques are useful for controlling other inductive loads. In the illustrated example, a controller 26 controls operation of a high side driver 28 on a first side of the coil 22 and a low side driver 30 on a second, opposite side of the coil 22 to control current flow through the coil 22 to achieve fuel injector performance as needed. The illustrated driver comprise solid state switches. Strategies for controlling fuel supply in an engine using fuel injectors are generally known. The controller 26 may include such an algorithm or may communicate with an engine control unit that provides such information. Those skilled in the art who have the benefit of this description will realize what specific fuel control strategies to use for their particular situation.

Although the controller 26 is schematically shown as a single component in FIG. 1, those skilled in the art who have the benefit of this description will appreciate that a variety of configurations utilizing multiple components, various hardware, software, firmware, microcontrollers or combinations of them are available to realize a controller 26 designed according to an embodiment of this invention. FIG. 2 shows one example where the controller 26 comprises multiple individual components.

The device 20 in FIG. 1 includes a shunt resistor 32 associated with the high side driver 28. An amplifier 34 is associated with the shunt resistor 32 to provide an indication to the controller 26 of a current in the shunt resistor 32. This current is a high side current that indicates an operational current within the coil 22. In one example, the amplifier 34 is a true differential amplifier. The amplifier 34 in this example provides closed loop control over the current in the coil 22. In one example, the differential amplifier has at least three features. First, the powering voltage for the differential amplifier is variable. In one example, the powering voltage can be between 40 and 60 volts.

Second, the differential amplifier is a true differential amplifier in the sense that it can handle floating associated with chopping using the low side driver 30. Because one side of the resistor 32 is not tied to ground when the low side driver 30 is off during chopping, the differential amplifier 34 preferably addresses such a floating condition. The common mode rejection ratio of the amplifier preferably is selected to ignore any jumping that may occur when the low side driver 30 is turned off. In one example, the common mode rejection ratio is at least 80 dB.

Third, the differential amplifier in one example has a bandwidth that is at least three to five times the chopping frequency for turning the low side driver on and off. In one example, the bandwidth is between 100 KHz and 250 KHz. This provides a high speed chopping operation where the chopping frequency can be, for example, in a range between 20 KHz and 50 KHz.

Figure 3:
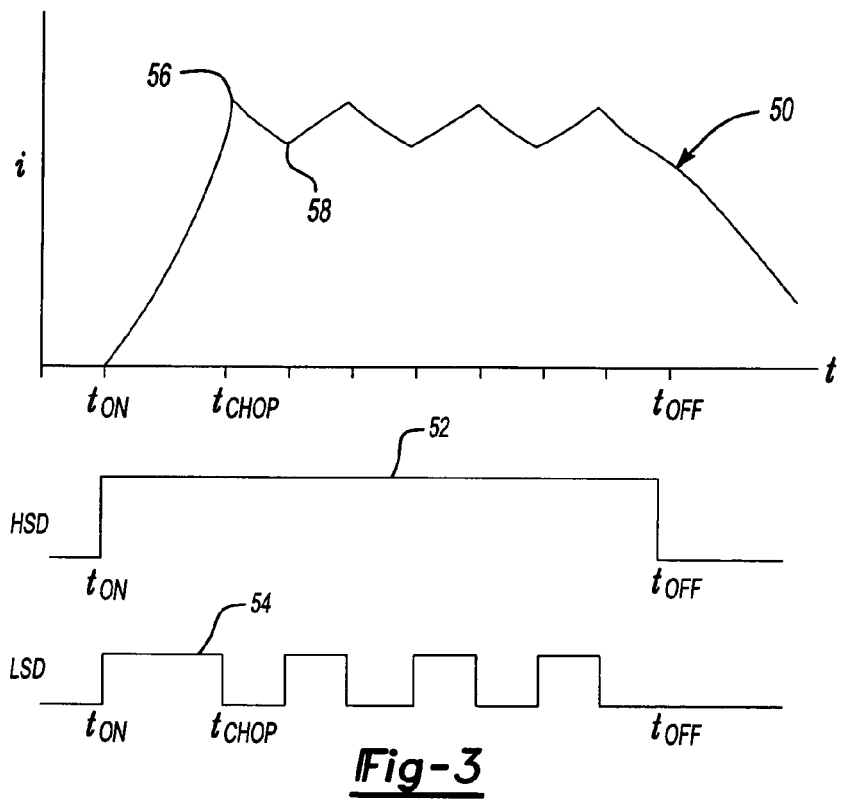
FIG. 3 graphically illustrates signal relationships of a current in an injector coil and control signals for a high side driver and a low side driver in an embodiment of this invention.

Referring to FIGS. 1 and 3, the device 20 can operate as follows. At a time $T_{on}$ the control 26 turns on the fuel injector, which requires powering the coil 22. At this time, the switches of the high side driver 28 and low side driver 30 are turned on to conduct current from the power source 24 through the coil 22 to ground. FIG. 3 shows that at the time $T_{on}$ the current 50 in the coil 22 begins to rise as the high side driver 28 is turned on at 52 and the low side driver 30 is turned on as shown by the signal 54. The rise time associated with the current in the coil 22 results from the inductance of the coil.

When the current level reaches a desired maximum 56, the control 26 determines that it is necessary to begin chopping to avoid an overcurrent situation. Given a particular device and this description, those skilled in the art will be able to select an appropriate limit when chopping should begin. At the time $T_{chop}$ the powering signal 54 for the low side driver 30 moves to a logical low so that the low side driver 30 is turned off. At this point the current 50 within the coil 22 begins to drop until it falls to a level at 58. At this time, the control 26 determines that the current should rise again so the low side driver 30 is again turned on. Keeping the current within a desired range is achieved by repeatedly and cyclically turning the low side driver on and off to achieve the necessary chopping.

Each time that the low side driver 30 is turned off, the output stage enters a free wheeling mode as the current in the coil falls. The example of FIG. 1 includes a recharging circuit 40 that extends from between the coil 22 and the low side driver 30 at one end and the power source 24 at the other end. The recirculation circuit 40 includes a free wheeling diode 42 that allows current to flow back to the power source 24 when the switch 30 is turned off. In this mode, current in the injector coil flows down from the power source 24 through the high side shunt resistor 32, through the high side driver 28, through the injector coil 22 and then back up through the free wheeling diode 42 toward the power source 24.

Once the coil current falls to the lower limit (i.e., the point 58 in FIG. 3), the low side driver 30 is turned back on and the injector coil current begins rising again.

Once the injector should be turned off, the controller 26 turns off both the high side driver 28 and the low side driver 30. In the example of FIG. 3, the low side driver 30 is already turned off at the time $T_{off}$ because of the timing and frequency of the chopping and how that corresponded to the interval between $T_{on}$ and $T_{off}$.

When both drivers are turned off, current flows through the coil 22 in a second recharging circuit 44 that extends between the high side driver 28 and the coil 22 and ground. A recirculation diode 46 allows current to flow up from ground through the diode 46 down through the injector coil then through the recharging circuit 40 through the free wheeling diode 42 back to the power supply 24. After all of the energy stored in the injector coil 22 has been returned to the power supply, the device 20 remains stable and awaits a new on signal from the controller 26.

The example embodiment of this invention differs substantially from previous approaches in that the controller 26 relies only upon current measurement on the high side of the coil 22 associated with the high side driver 28. There is no current measurement required on the opposite side of the coil 22 as was done with previous arrangements. Additionally, the example embodiment utilizes the low side driver 30 to achieve chopping, as opposed to using the high side driver 28 for chopping as was done in previous arrangements. By reducing the amount of current monitoring components required and utilizing the low side driver 30 for chopping, the disclosed example provides substantial savings in number of components, device volume, reliability, while also reducing the complexity of the control circuitry required.

FIG. 2 illustrates another example embodiment showing multiple injector coils 22A, 22B through 22N. In a six cylinder engine, there typically are six fuel injectors and this example embodiment shows how to power each injector individually so that there is no overlap between the powering signals using techniques that are known. One difference between the example of FIG. 2 and that of FIG. 1 is that the controller 26 is only partially shown. One portion 26A is associated directly with the high side driver 28 and another portion 26B provides the comparator function between the measured current in the coil and a reference value $V_r$. A microcontroller portion is not illustrated in FIG. 2 but it processes the diagnosis, logic-level, current feedback and enable signals. Another difference between the embodiments of FIGS. 1 and 2 is that the shunt resistor 32 is positioned between the high side driver 28 and the coils 22 of the fuel injectors. By placing the shunt register 32 in this position, it is possible to monitor the decay rate of the current within the coils.

In another example, the smart high side driver 26A has the current monitoring function integrated into the driver electronics so that a separate differential amplifier 34 may not be required.

In the example embodiment of FIG. 2, AND gates 60 are associated with each low side driver 30 so that the individual coils can be controlled based upon the enable signals provided to each AND gate combined with the current feedback signal associated with the controller 26. A single high side driver 28 is used for all coils 22. Such an arrangement allows for timing the opening and closing of each fuel injector according to a fuel supply strategy. A single high side driver provides for no overlap in the control signals to the fuel injectors. If a fuel supply strategy requires any partial overlap in fuel injection, then two high side drivers (one for the odd cylinders and one for the even cylinders) may be used.

The rise time associated with the current in the coil depends not only on the inductance of the coil but also on the voltage value from the power source 24. One control strategy includes monitoring any voltage swings from the power source and adjusting the timing of turning on the coil so that the injector on time corresponds to a desired time. For example, when the voltage source is at an expected level, the rise time will have an expected curve. When the voltage level from the power source is lower than the expected level, the rise time is longer and there is a delay in the turn on of the injector coil. Conversely, where the voltage is higher, the rise time becomes shorter and the fuel injector turns on faster.

One example control strategy includes determining the voltage of the power source and adjusting the turn on time accordingly. If the voltage is lower than a base value, the turn on time is made earlier so that the actual injector on time is as expected or desired. Conversely, where the voltage is higher than the base value, the turn on time is delayed so that the actual injector on time is as desired. This particular control strategy applies for systems where the power source is not necessarily a stable, regulated voltage source. It is possible to eliminate high power DC-to-DC converters when using such a control strategy.

In one example, a voltage divider is used along with an analog-to-digital channel on a microcontroller to measure the voltage from the power source. In one example, the voltage source is nominally 48 volts but there may be voltage swings to make that higher or lower. When the voltage is different than 48 volts, the turn on time for the injector is changed accordingly so that the actual on time based on the expected current rise ramp occurs when desired.

In another example, a control strategy includes predicting how long it will take for the coil current to increase from zero to 20 amps (i.e., the rise time). This is accomplished by measuring (using existing hardware) how much time elapses between the rising edge of the forward pulse of the control signal and the time when the current in the coil reaches 20 amps. This time value can then be stored for each injector individually and used to predict the next time from a forward pulse control signal to achieving 20 amps in the coil. This approach is adaptive and accurate and can be accomplished in a very economical manner.

Part of this control strategy is based upon the realization that at the lowest engine speed of 600 rpm, there are only 200 milliseconds between activations of a particular injector. Neither voltage or inductance change very quickly and these are the two factors on which ramp rate of injector current largely depends. Therefore, performance in the immediate past is a good predictor of performance in the immediate future.

This particular approach does not require a regulated power supply from which to activate fuel injectors. As power supply voltage is a major factor in how long an injector current rises from zero to 20 amps, accurately predicting how long it will take to complete this current ramp allows an unregulated power supply to be used. Unregulated power supplies have advantages because they can be cheaper, simpler, smaller and lighter than regulated supplies.

Storing information about how long it took to go from zero to 20 amps during a previous turn on cycle provides a good prediction of the likely ramp time on a current activation. By storing the length of time that elapsed during the last application of voltage in the first achievement of 20 amps in the injector coil, a correction factor can be applied to injection timing the next time that the injector is turned on to allow for the time required to accomplish the necessary current ramp. This approach not only does not require a regulated voltage source, but also does not require a measurement of injector bus voltage. Precise control of injection timing is accomplished by utilizing the ramp time of the last injection and relating that to the ramp time of a subsequent injection.

Figure 4:
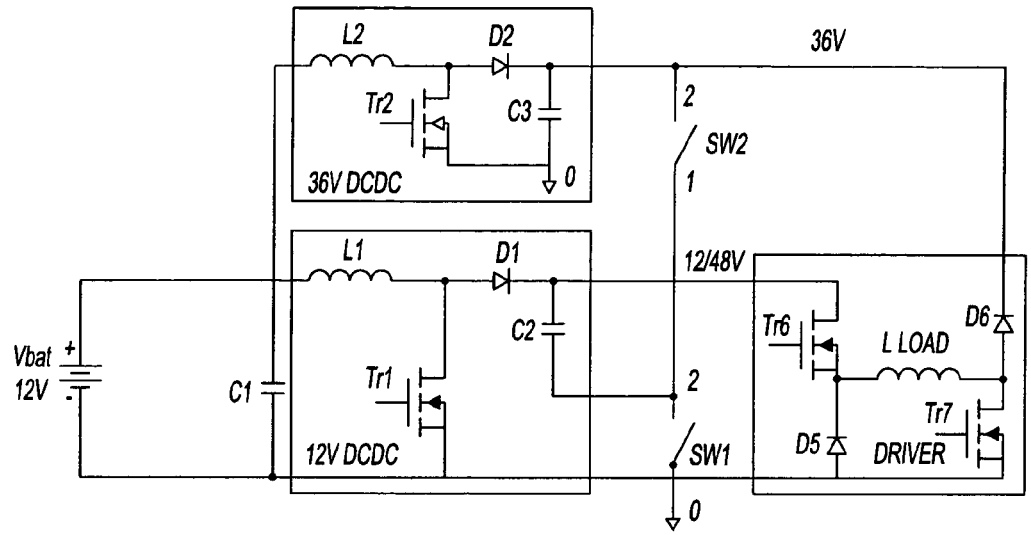
FIG. 4 schematically illustrates an alternate powering arrangement.
Figure 5:
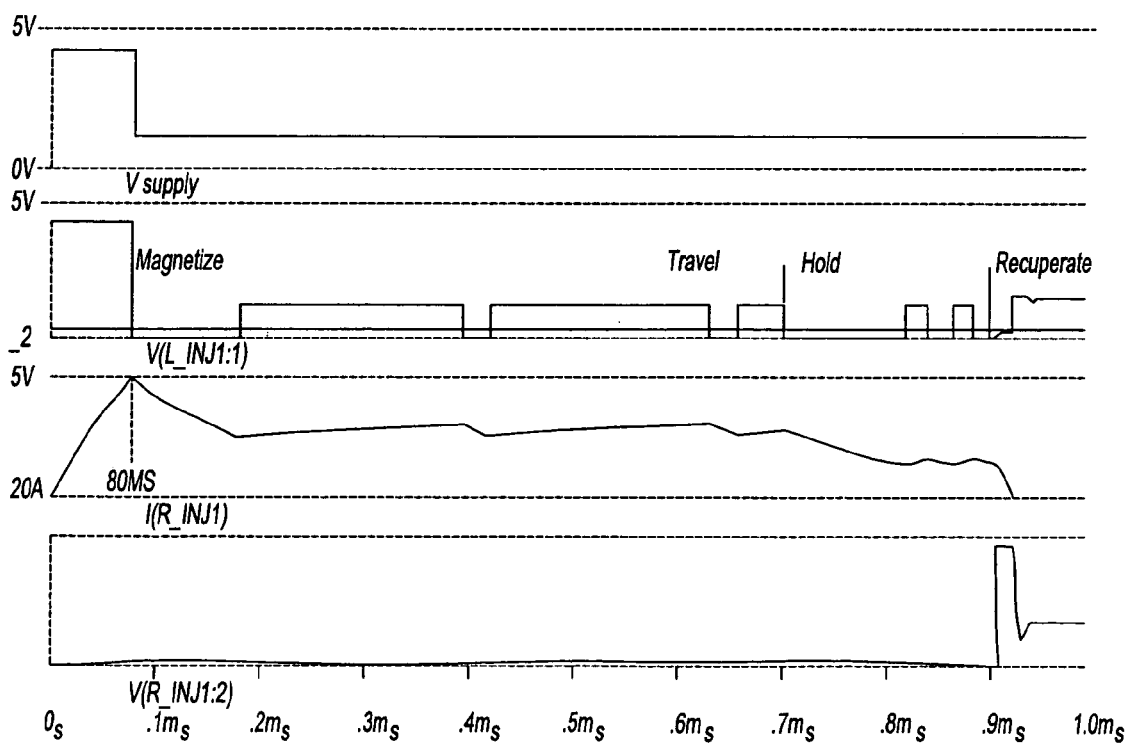
FIG. 5 graphically illustrates signal relationships for the embodiment of FIG. 4.

Referring to FIGS. 4 and 5, an alternative power supply concept for a fuel injector includes a 12 volt DC-to-DC converter that generates a 12 volt output voltage from a battery on a vehicle. This converter is not operating as long as the battery voltage is high enough to power the fuel injector, but starts operating during low battery conditions to provide the injector coil with the voltage needed to operate the injector. When the converter is not operating normally, the storage components C1, L1 and C2 act as a third order low pass filter toward the battery line.

A small 36 volt DC-to-DC converter outputs an average current of approximately 1 amp and peak current of up to 20 amps. These peak currents, while lasting only for a very short period of time, are mainly supplied from the capacitor C3, which is being replenished during the time between the current pulses. This DC-to-DC converter operates continuously.

Two switches SW1 and SW2 switch the low side of the capacitor C2 between ground (when SW1 is closed) and 36 volts (when SW2 is closed). The switches are operated in a break-before-make operation mode. The switches can be implemented as CMOS FETs with SW1 being a low side switch and SW2 being a high side switch.

This apply operation is directly linked to the operation of the coil drivers and to the injector operation. Accordingly, the electronics function is linked to the injector timing.

During the magnetization phase when the current ramps up from zero to 20 amps, the switch SW1 is open and the switch SW2 is closed. The supply voltage for the coil driver at this time is 48 volts (i.e., 12 volts plus 36 volts). The switch SW2 remains closed until 20 amps are reached in the coil.

During a travel phase, the coil current is held at 10 amps. During this phase the switch SW2 opens and the switch SW1 closes. The supply voltage for the coil driver is now returned to 12 volts, which is still high enough to allow for the 10 amps required for coil operation, but with a low number of PWM pulses. These pulses are now 12 volts, not 48 volts.

During a hold phase the coil current is reduced to 5 amps. During the hold phase, the switch operation is the same as the travel phase.

During the recuperation phase, the coil current collapses to zero in a rapid fashion. The driver FETs TR5 and TR6 are both turned off, which allows the stored magnetic energy of the coil to flow back to the 36 volt DC-to-DC converter through the diodes D5 and D6.

With this approach, almost all of the switching is done with much less power involved. This makes it possible to increase switching times by more than an order of magnitude compared to chopping achieved with other approaches. The amplitude of the switching voltage can be reduced by a factor of four for most pulses. The combination of these two properties reduces the EMI radiated emissions to something well below acceptance levels. The power losses related to the new operation scheme are further more reduced and so do the power components of the DC-to-DC converters. Additionally, this approach allows for removing otherwise expensive power components and makes the control module simpler, which provides production economies.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

What is claimed is:

1. A method of powering an inductive coil that has a high side driver on a first side of the coil and a low side driver on an opposite side of the coil, comprising:
   monitoring a current level on only the first side of the coil; and determining a level of current in the coil during fuel injector operation and using the level of current to control a switch state of the low side driver.

2. The method of claim 1, including cyclically turning the low side driver on ad off responsive to the current level to control the current in the coil.

3. The method of claim 1, including controlling an operating current in the coil using the current on the first side of the coil and determining whether a current on a side of a high side driver that is opposite from the coil exceeds a desirable range using the current on the first side of the coil.

4. The method of claim 3, including determining a decaying current level in the coil.

5. The method of claim 3, including using a single differential amplifier for the controlling and the determining.

6. The method of claim 1, including turning on the high side driver when the coil is being powered and cyclically turning the low side driver on and off when the coil is being powered to thereby control a current level in the coil.

7. The method of claim 6, including recharging a power source using a discharge current from the coil when at least one of the drivers is off.

8. A device for powering an inductive coil, comprising:
   a high side driver on a first side of the coil;
   a low side driver on a second side of the coil; and
   a controller that monitors a current level on only the first side of the coil;
   wherein the controller controls a switch state of the drivers responsive to the level of the current to control a current level in the coil, and wherein the controller cyclically turn the low side driver on and off to control an operating current in the coil.

9. A device for powering an inductive coil, comprising:
   a high side driver on a first side of the coil;
   a low side driver on a second side of the coil;
   a controller that monitors a current level on only the first side of the coil;
   a high side shunt associated with the high side driver and
   a differential amplifier coupled with the shunt, the differential amplifier providing a current level indication to the controller.

10. The device of claim 9, wherein the high side shunt is between the high side driver and the coil and wherein the controller determines a decaying current in the coil when at least one of the drivers is off.

11. The device of claim 9, wherein the differential amplifier has a common mode rejection ratio that is at least 80 dB.

12. The device of claim 9, wherein the differential amplifier has a bandwidth that is at least about three times a frequency of the turning the low side driver on and off.

13. A device for powering an inductive coil, comprising:
    a high side driver on a first side of the coil;
    a low side driver on a second side of the coil; and
    a controller that monitors a current level on only the first side of the coil including a first recharging circuit having one end coupled between the coil and the low side driver and a second end coupled to recharge a power source, the first recharging circuit including a diode that allows a discharge current from the coil to flow through the first circuit when the low side driver is off.

14. The device of claim 13, including a second recharging circuit having one end coupled to ground and a second end coupled between the high side driver and the coil, the second recharging circuit including a diode that allows current to flow from the ground to the coil so that a discharge current from the coil flows through the first recharging circuit when the high side driver is off.

15. A device for powering an inductive coil, comprising:
    a high side driver on a first side of the coil;
    a low side driver on a second side of the coil; and
    a controller that monitors a current level on only the first side of the coil wherein the inductive coil is associated with a valve and the coil controls an open position of the valve.

16. A device for powering an inductive coil, comprising:
    a high side driver on a first side of the coil;
    a low side driver on a second side of the coil; and
    a controller that monitors a current level on only the first side of the coil wherein the coil is associated with a fuel injector.

* * * * *